(12) United States Patent
Anpo

(10) Patent No.: US 8,755,924 B2
(45) Date of Patent: *Jun. 17, 2014

(54) CHARGED PARTICLE BEAM WRITING METHOD AND APPARATUS THEREFOR

(75) Inventor: Akihito Anpo, Tokyo (JP)

(73) Assignee: NuFlare Technology, Inc., Numazu-shi (JP)

(*) Notice: Subject to any disclaimer, the term of this patent is extended or adjusted under 35 U.S.C. 154(b) by 798 days.

This patent is subject to a terminal disclaimer.

(21) Appl. No.: 12/874,722

(22) Filed: Sep. 2, 2010

(65) Prior Publication Data

US 2011/0066272 A1 Mar. 17, 2011

(30) Foreign Application Priority Data

Sep. 15, 2009 (JP) ................................. 2009-212779

(51) Int. Cl.
*G05B 13/02* (2006.01)
*G06F 19/00* (2011.01)
*G21G 5/00* (2006.01)
*G21K 5/00* (2006.01)

(52) U.S. Cl.
USPC ............... 700/103; 700/28; 700/90; 700/95; 700/97; 700/121; 250/492.1; 250/492.21; 250/492.2; 250/492.22; 250/492.3

(58) Field of Classification Search
USPC .......... 700/28, 90, 95, 97, 103, 121; 250/492.1, 492.21, 492.2, 492.22, 250/492.3
See application file for complete search history.

(56) References Cited

U.S. PATENT DOCUMENTS 5,995,878 A * 11/1999 Miyajima ..................... 700/121
6,313,476 B1 * 11/2001 Shimizu et al. ........... 250/492.22

(Continued)

FOREIGN PATENT DOCUMENTS

| JP | 5-74693 A | 3/1993 |
| JP | 11-274036 | 10/1999 |

(Continued)

OTHER PUBLICATIONS

U.S. Appl. No. 13/765,140, filed Feb. 12, 2013, Kato, et al.

(Continued)

*Primary Examiner* — Mohammad Ali
*Assistant Examiner* — Jennifer L Norton
(74) *Attorney, Agent, or Firm* — Oblon, Spivak, McClelland, Maier & Neustadt, L.L.P.

(57) ABSTRACT

A charged particle beam writing method includes inputting layout information of a plurality of chips on which pattern formation is to be achieved, setting, using the layout information, a plurality of writing groups each being composed of at least one of the plurality of chips and each having writing conditions differing from each other, setting, for each of the plurality of writing groups, a frame which encloses a whole of all chip regions in the each of the plurality of writing groups, virtually dividing the frame into a plurality of stripe regions in a predetermined direction, with respect to the each of the plurality of writing groups, setting, using the plurality of stripe regions of all the plurality of writing groups, an order of each of the plurality of stripe regions such that a reference position of the each of the plurality of stripe regions is located in order in the predetermined direction regardless of the plurality of writing groups, and writing a pattern in the each of the plurality of stripe regions onto a target workpiece according to the order which has been set, by using a charged particle beam.

5 Claims, 10 Drawing Sheets

(56) References Cited

U.S. PATENT DOCUMENTS

| | | | | |
|---|---|---|---|---|
| 6,433,347 | B1* | 8/2002 | Suzuki | 250/492.22 |
| 7,592,611 | B2* | 9/2009 | Kasahara et al. | 250/492.22 |
| 7,863,586 | B2* | 1/2011 | Abe | 250/492.22 |
| 8,471,225 | B2* | 6/2013 | Anpo | 250/492.22 |
| 8,563,952 | B2* | 10/2013 | Yashima et al. | 250/492.22 |
| 2006/0019173 | A1* | 1/2006 | Yamamoto | 430/5 |
| 2006/0169926 | A1* | 8/2006 | Mizuno | 250/492.22 |
| 2006/0289805 | A1* | 12/2006 | Nakasugi et al. | 250/492.23 |
| 2007/0053242 | A1* | 3/2007 | Kasahara et al. | 369/13.01 |
| 2008/0046787 | A1* | 2/2008 | Anpo et al. | 714/701 |
| 2009/0032738 | A1* | 2/2009 | Takekoshi | 250/492.22 |
| 2009/0057570 | A1 | 3/2009 | Abe | |
| 2009/0057575 | A1* | 3/2009 | Oogi et al. | 250/492.22 |
| 2012/0211674 | A1* | 8/2012 | Kato | 250/492.3 |
| 2013/0320230 | A1* | 12/2013 | Yoshikawa et al. | 250/398 |
| 2013/0334442 | A1* | 12/2013 | Kamikubo | 250/492.3 |

FOREIGN PATENT DOCUMENTS

| | | |
|---|---|---|
| JP | 2001-110700 A | 4/2001 |
| JP | 2007-103923 | 4/2007 |
| JP | 2009-54944 | 3/2009 |

OTHER PUBLICATIONS

Office Action issued Sep. 16, 2011 in Korea Application No. 10-2010-89718 (With English Translation).

Office Action issued Oct. 29, 2013 in Japanese Patent Application No. 2009-212779 with English language translation.

Office Action issued Apr. 23, 2012 in Korean Application No. 10-2010-89718 (With English Translation).

* cited by examiner

Writing Condition Example

| Chip | Writing Group | Stripe Height | Stage Movement Path | Multiplicity (The number of Stripe Layers) | Stage Speed |
|---|---|---|---|---|---|
| A | I | 200 | FWD/BWD | 1 | Constant Speed |
| B | | | | | |
| C | II | 200 | FWD/FWD | 2 | Variable Speed |

CHARGED PARTICLE BEAM WRITING METHOD AND APPARATUS THEREFOR

CROSS-REFERENCE TO RELATED APPLICATION

This application is based upon and claims the benefit of priority from prior Japanese Patent Application No. 2009-212779 filed on Sep. 15, 2009 in Japan, the entire contents of which are incorporated herein by reference.

BACKGROUND OF THE INVENTION

1. Field of the Invention

The present invention relates to a charged particle beam writing method and a charged particle beam writing apparatus. For example, it relates to a writing method and a writing apparatus employed when writing patterns of a plurality of chips having different writing conditions onto a target workpiece.

2. Description of Related Art

The microlithography technique which advances microminiaturization of semiconductor devices is extremely important as being the unique process whereby patterns are formed in the semiconductor manufacturing. In recent years, with the high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Then, the electron beam writing technique intrinsically having excellent resolution is used for producing such a highly precise master pattern.

FIG. 10 is a schematic diagram for illustrating operations of a variable-shaped electron beam (EB) writing apparatus. As shown in the figure, the variable-shaped electron beam writing apparatus operates as follows: A first aperture plate 410 has a quadrangular such as rectangular opening 411 for shaping an electron beam 330. A second aperture plate 420 has a variable-shaped opening 421 for shaping the electron beam 330 that passed through the opening 411 into a desired rectangular shape. The electron beam 330 emitted from a charged particle source 430 and having passed through the opening 411 is deflected by a deflector to pass through a part of the variable-shaped opening 421 and thereby to irradiate a target workpiece or "sample" 340 mounted on a stage which continuously moves in one predetermined direction (e.g. X direction) during writing or "drawing". In other words, a rectangle shape as a result of passing through both the opening 411 and the variable-shaped opening 421 is written in the writing region of the target workpiece 340 on the stage. This method of shaping a given shape by letting beams pass through both the opening 411 of the first aperture plate 410 and the variable-shaped opening 421 of the second aperture plate 420 is referred to as a VSB (Variable Shaped Beam) method.

It is generally performed to write patterns of a plurality of chips onto a mask being a target workpiece. Then, writing conditions may often vary depending upon the chips. For example, a certain chip is written by one-time writing (multiplicity=1), and another certain chip is written by multiple writing (e.g., multiplicity=2) while the position of a boundary between stripe regions is shifted (refer to, e.g., Japanese Patent Application Laid-open (JP-A) No. 11-274036). Conventionally, in the electron beam pattern writing apparatus, when writing patterns of a plurality of chips onto a mask, a writing group is configured by collecting chips whose writing conditions with respect to layout within a certain range are identical with each other, and then writing is performed for each writing group. Thus, when writing is performed in one writing group, the writing is carried out under the same writing conditions.

FIG. 11 is a schematic diagram for illustrating writing groups and a writing order. FIG. 11 illustrates the case where three chips A, B, and C are arranged as shown in the figure. In this case, chip A and chip B are written with multiplicity 1, and chip C is written with multiplicity 2. That is, chips A and B having the same writing conditions configure a writing group G1, and chip C configures a writing group G2. In the writing group G1, merge processing is performed on chips A and B, and the merged region is divided into stripe regions of a predetermined height. The case of dividing the merged region into two stripes of the stripe G1S1 and the stripe G1S2 is shown in FIG. 11. On the other hand, in the writing group G2, the region of chip C is divided into stripe regions of a predetermined height. Since chip C is written with multiplicity 2, two stripe layers are configured: a stripe layer for the first time writing, and another stripe layer for the second time writing which is divided at the location shifted by half the stripe height. That is, they are stripes G2S1 and G2S2, and stripes G'2S1 to G'2S3. Thus, in FIG. 11, the writing group G2 is divided into five stripes. When writing, the two stripes of the writing group G1 are firstly written in order. Then, after having written all the stripes of the writing group G1, the five stripes of the writing group G2 are written in order.

As described above, when writing is performed for each writing group, one writing processing is completed by firstly writing the two stripes of the writing group G1 in order and then writing all the stripes of the writing group G1. Then, writing processing of the writing group G2 is started. Thus, the writing is performed treating a writing group as a unit of writing processing. Therefore, it is necessary to have a fixed time needed for information generation between the writing processing, and a processing time, such as an initialization time, needed between the writing processing. Furthermore, since writing of the writing group G2 starts after having completed the writing of all the stripes of the writing group G1 and having returned to the writing starting position of the writing group G2, it is necessary to have a time for moving the stage with a target workpiece thereon from the final position of the writing group G1 to the starting position of the writing group G2. If this distance between the final position and the staring position is long, the stage movement time also becomes long in accordance with the distance. Since such time is added to the writing time, there is a problem causing a delay of writing time as a whole. Particularly, if the number of chips having different writing conditions increases, since the number of writing groups also increases according to it, each above-mentioned time becomes necessary in accordance with the increase of the number of writing groups, thereby further causing a delay of the writing time.

BRIEF SUMMARY OF THE INVENTION

In accordance with one aspect of the present invention, a charged particle beam writing method includes inputting layout information of a plurality of chips on which pattern formation is to be achieved, setting, using the layout information, a plurality of writing groups each being composed of at least one of the plurality of chips and each having writing conditions differing from each other, setting, for each of the plurality of writing groups, a frame which encloses a whole of all chip regions in the each of the plurality of writing groups, virtually dividing the frame into a plurality of stripe regions in a predetermined direction, with respect to the each of the plurality of writing groups, setting, using the plurality of stripe regions of all the plurality of writing groups, an order of each of the plurality of stripe regions such that a reference position of the each of the plurality of stripe regions is located in order in the predetermined direction regardless of the plurality of writing groups, and writing a pattern in the each of the plurality of stripe regions onto a target workpiece according to the order which has been set, by using a charged particle beam.

In accordance with another aspect of the present invention, a charged particle beam writing apparatus includes a storage device configured to input layout information of a plurality of chips on which pattern formation is to be achieved, and store the layout information, a writing group setting unit configured to set, using the layout information, a plurality of writing groups each being composed of at least one of the plurality of chips and each having writing conditions differing from each other, a frame setting unit configured to set, for each of the plurality of writing groups, a frame which encloses a whole of all chip regions in the each of the plurality of writing groups, a region dividing unit configured to virtually divide the frame into a plurality of stripe regions in a predetermined direction, with respect to the each of the plurality of writing groups, an order setting unit configured to set, using the plurality of stripe regions of all the plurality of writing groups, an order of each of the plurality of stripe regions such that a reference position of the each of the plurality of stripe regions is located in order in the predetermined direction regardless of the plurality of writing groups, and a writing unit configured to write a pattern in the each of the plurality of stripe regions onto a target workpiece according to the order which has been set, by using a charged particle beam.

DETAILED DESCRIPTION OF THE INVENTION

In the following Embodiments, there is described a structure using an electron beam as an example of a charged particle beam. However, the charged particle beam is not limited to the electron beam. Other charged particle beam, such as an ion beam, may also be used. Moreover, a variable-shaped writing apparatus will be described as an example of a charged particle beam apparatus.

Embodiment 1

Figure 1:
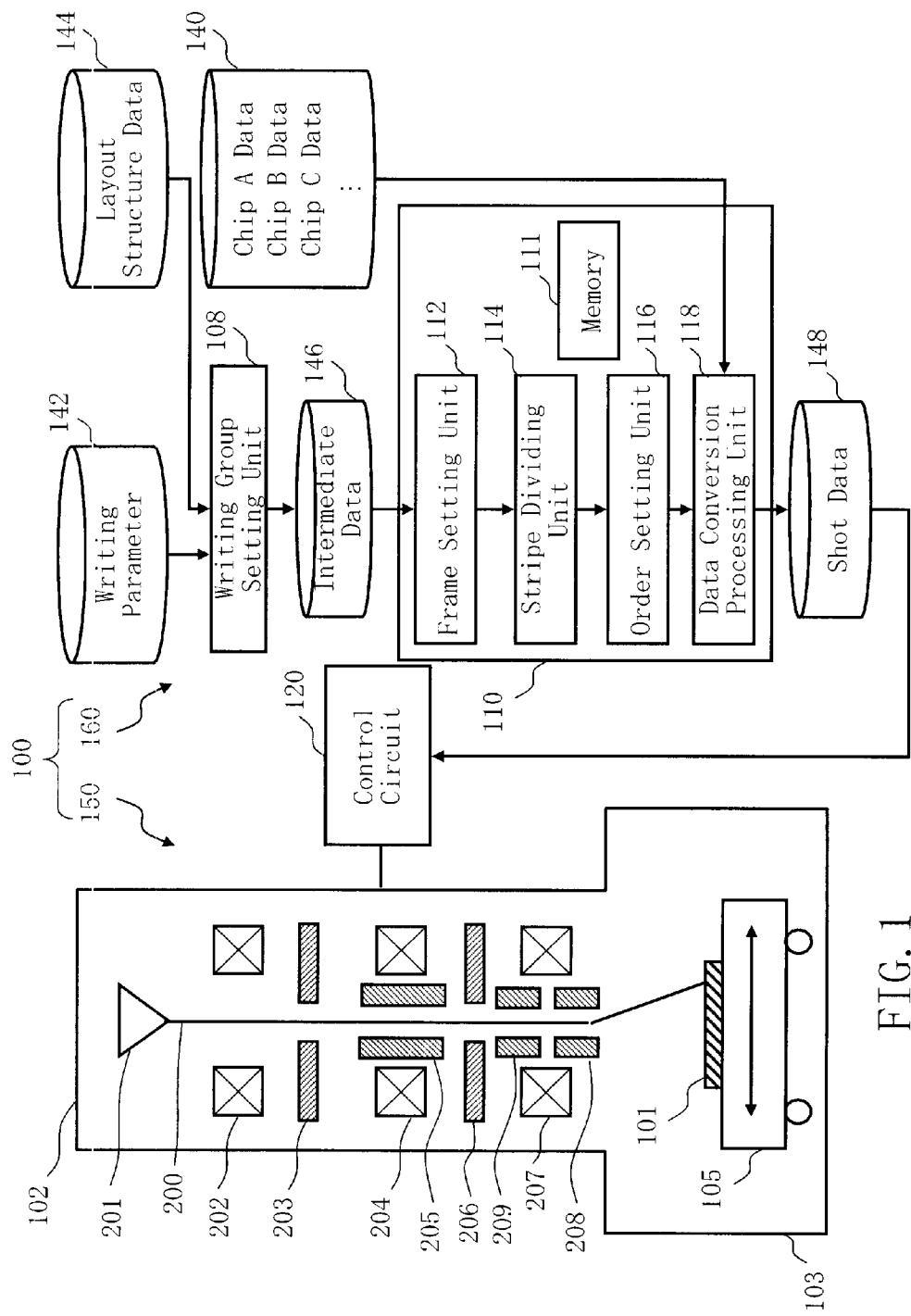
FIG. 1 is a schematic diagram showing a structure of a writing apparatus according to Embodiment 1.

FIG. 1 is a schematic diagram showing an example of the structure of a writing apparatus according to Embodiment 1. In FIG. 1, a writing apparatus 100 includes a writing unit 150 and a control unit 160. The writing apparatus 100 is an example of a charged particle beam writing apparatus. Particularly, it is an example of the variable-shaped writing apparatus. The writing unit 150 includes an electron lens barrel 102 and a writing chamber 103. In the electron lens barrel 102, there are arranged an electron gun assembly 201, an illumination lens 202, a first aperture plate 203, a projection lens 204, a deflector 205, a second aperture plate 206, an objective lens 207, a main deflector 208, and a sub-deflector 209. In the writing chamber 103, there is arranged an XY stage 105, on which a target workpiece 101, such as a mask, serving as a writing object is placed. The target workpiece 101 is, for example, a photomask used for exposure in manufacturing semiconductor devices. The target workpiece 101 may be a mask blank where no patterns are formed.

The control unit 160 includes a writing group setting unit 108, a control computer unit 110, a control circuit 120, and storage devices, such as magnetic disk drives, 140, 142, 144, 146, and 148. They are connected with each other by a bus (not shown).

In the control computer unit 110, there are arranged a memory 111, a frame setting unit 112, a stripe dividing unit 114, an order setting unit 116, and a data conversion processing unit 118. The frame setting unit 112, the stripe dividing unit 114, the order setting unit 116, and the data conversion processing unit 118 may be configured by hardware such as an electric circuit, or may be configured by software such as a program implementing these functions. Alternatively, they may be configured by a combination of hardware and software. Information (data) which is input/output to/from the frame setting unit 112, the stripe dividing unit 114, the order setting unit 116, and the data conversion processing unit 118, and information (data) which is being calculated are stored in the memory 111 each time. Particularly, since the amount of data processed by the data conversion processing unit 118 may be enormous, it is preferable for the data conversion processing unit 118 to be configured by a plurality of CPUs (not shown), a plurality of memories (not shown), etc. Further, the writing group setting unit 108 may be configured by hardware such as an electric circuit, or may be configured by software such as a program implementing these functions. Alternatively, it may be configured by a combination of hardware and software.

With respect to the storage device 140, a plurality of chip data used as layout data is input into it from the outside of the apparatus so as to be stored. For example, the chip data of chip A, the chip data of chip B, the chip data of chip C, and so forty are stored to be used when pattern forming of each chip is performed.

With respect to the storage device 142, a writing parameter indicating writing conditions of each chip is input into it from the outside of the apparatus so as to be stored, for example. As the writing conditions, there can be cited multiplicity for multiple writing, a stage movement path of the XY stage 105, a stage speed of the XY stage 105, a stripe height or "stripe width" (dividing height or "dividing width"), a subfield (SF)

size, and an irradiation amount (dose), for example. The stripe height or "stripe width" for dividing indicates a dimension of the stripe in the y direction. The stage movement path includes a path which defines the writing direction of writing each stripe in order, such as forward-forward (FF), forward-backward (FB), backward-forward (BF), or backward-backward (BB). Moreover, the stage speed includes, for example, a bundle optimization speed, a speed for constant velocity writing, a speed for variable velocity writing, and a speed for step-and-repeat (S&R) writing.

With respect to the storage device 144, layout structure data (layout information) indicating a layout structure of each chip is input into it from the outside of the apparatus so as to be stored, for example.

FIG. 1 shows a structure which is necessary for describing Embodiment 1. Other structure elements generally necessary for the pattern writing apparatus 100 may also be included. For example, although the main and sub two-stage deflectors, namely the main deflector 208 and the sub-deflector 209, are used for deflecting a position, a one-stage deflector instead of the two-stage deflector may also be applied to the position deflection.

Figure 2:
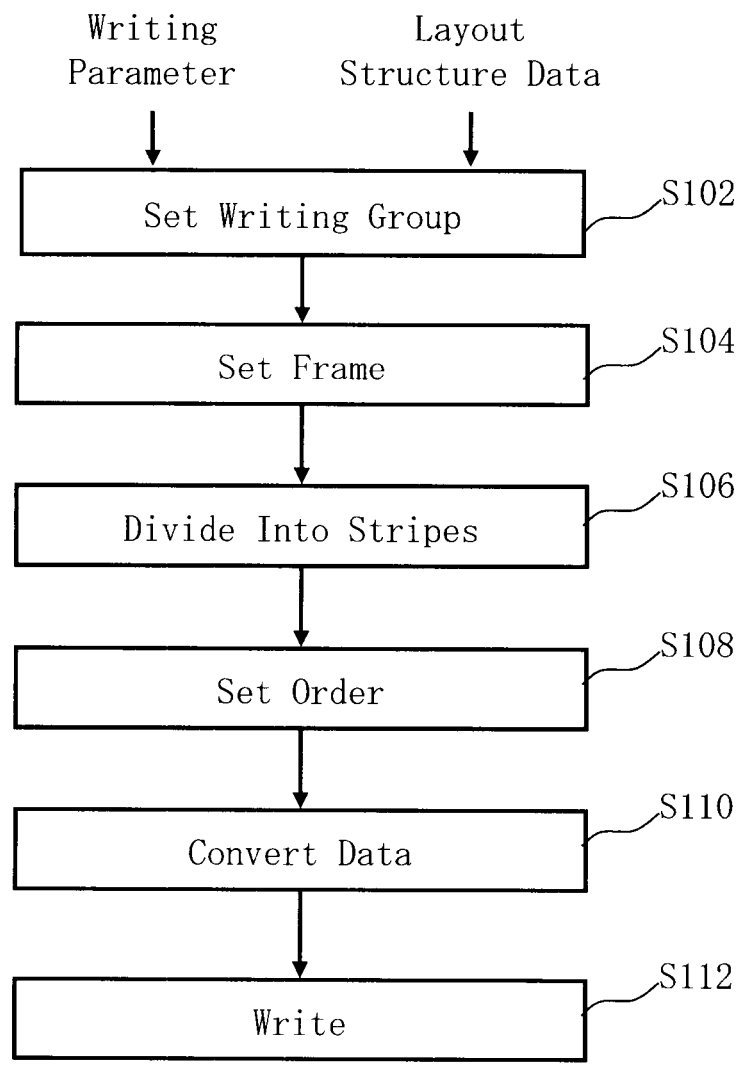
FIG. 2 is a flowchart showing main steps of a writing method according to Embodiment 1.

FIG. 2 is a flowchart showing the main steps of the writing method according to Embodiment 1. In FIG. 2, the writing method of Embodiment 1 executes a series of steps: a writing group setting step (S102), a frame setting step (S104), a stripe dividing step (S106), an order setting step (S108), a data conversion processing step (S110), and a writing step (S112).

Figure 3:
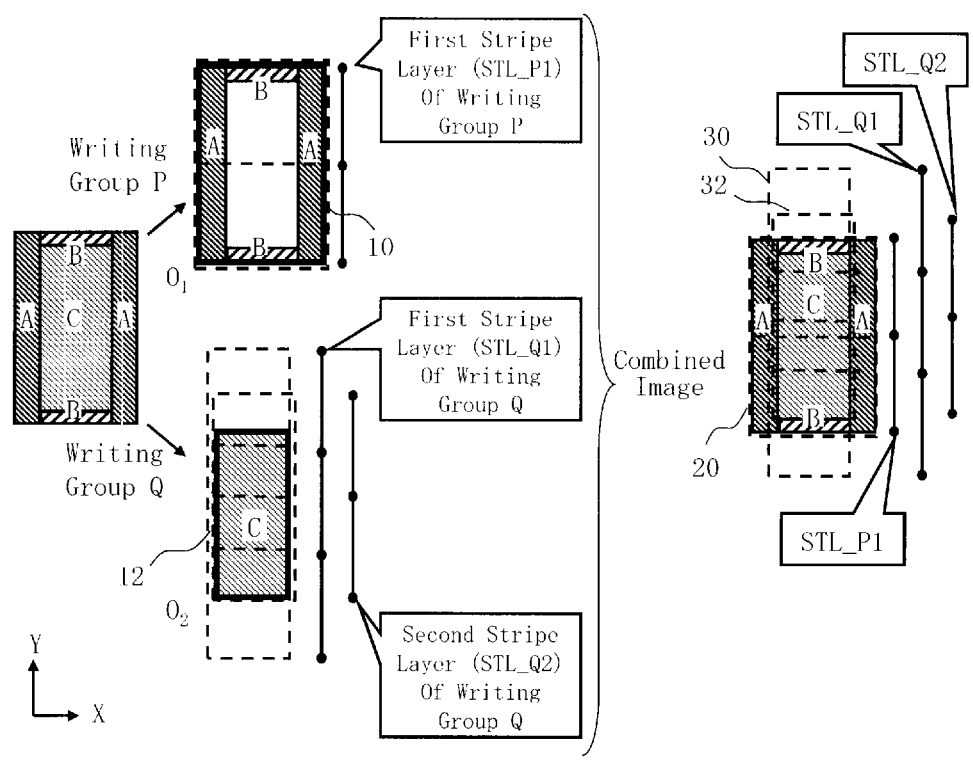
FIG. 3 is a schematic diagram for illustrating a writing group and a combined stripe layer according to Embodiment 1.

FIG. 3 is a schematic diagram for illustrating a writing group and a combined stripe layer according to Embodiment 1. In the case of FIG. 3, the three chips A, B, and C are arranged as shown in the figure. In the example of FIG. 3, the rectangular chip C is arranged in the center. Then, two rectangular chips A which are long in the Y direction (vertically long) are arranged such that they sandwich chip C and two chips B, from the right and left respectively. The length in the Y direction of chip A is defined to be the same as the total length in the Y direction of chip C and two chips B. Two chips B which are long in the X direction (horizontally long) are arranged such that they sandwich chip C from the upper and lower sides respectively. The length in the X direction of chip B is made to be the same as the length in the X direction of chip C. In this case, chips A and B are written with multiplicity 1, and chip C is written with multiplicity 2. Other writing conditions of chip A and chip B shall be identical with each other.

In S102, as the writing group setting step, the writing group setting unit 108 reads a writing parameter of each chip from the storage device 142 and layout structure data from the storage device 144. Using the layout structure data, the writing group setting unit 108 virtually lays out each chip, and sets a writing group composed of at least one chip by collecting chips whose writing parameters are the same. For example, it is preferable to collect chips having the same writing parameters in a predetermined region. In this way, the writing group setting unit 108 sets a plurality of writing groups which have writing conditions differing from each other. In the example of FIG. 3, writing group P is composed of chips A and B whose writing conditions are identical with each other, and writing group Q is composed of chip C. Therefore, FIG. 3 shows the case of setting two writing groups P and Q. Then, group information on the set writing group and writing conditions of each writing group are output to the storage device 146 to be stored.

Next, in S104, as the frame setting step, the frame setting unit 112 reads group information on a writing group and writing conditions of each writing group from the storage device 146, and sets, for each writing group, a frame which encloses the whole of all the chip regions in the writing group concerned. The frame according to Embodiment 1 is set such that it encloses the whole of all the chip regions in the writing group concerned while circumscribing the chip regions located at the outer peripheral side. In the example of FIG. 3, with respect to the writing group P, a circumscribing frame 10 formed to be rectangular is set such that it contacts the outer peripheral sides of two chips A and two chips B. With respect to the writing group Q, a circumscribing frame 12 formed to be rectangular is set such that it contacts the outer peripheral side of chip C. Thus, by applying the circumscribing frame, it becomes possible to set a rectangular frame of the minimum size enclosing the whole of all the chip regions in the writing group.

Next, in S106, as the stripe dividing step, the stripe dividing unit 114 virtually divides, for each writing group, the frame into a plurality of stripe regions being strip-like in a predetermined direction. In the example of FIG. 3, with respect to the writing group P, the circumscribing frame 10 is virtually divided by the stripe height or "stripe width" set by a writing parameter (writing conditions), into two stripe regions 20 to be strip-like in the Y direction. A first stripe layer (STL_P1) is composed of the two stripe regions 20. Since the writing group P is written with multiplicity N=1, only the first stripe layer (STL_P1) is set. With respect to the writing group Q, since it is written with multiplicity N=2, first, the circumscribing frame 12 is virtually divided by the stripe height specified by a writing parameter (writing conditions) into three stripe regions 30 to be strip-like in the Y direction for the first time writing layer (first stripe layer: STL_Q1). The first stripe layer is composed of the three stripe regions 30. A frame whose length is obtained by respectively adding one-half (½) of the stripe height, in the Y direction and in the −Y direction, to the circumscribing frame 12, is divided into the three stripe regions 30. In this case, since the multiplicity is N=2, one-half of the stripe height is added. For example, if the case is multiplicity N=4, three-fourth (¾) of the stripe height will be added. Furthermore, with respect to the writing group Q, the circumscribing frame 12 is virtually divided by the stripe height specified by a writing parameter (writing conditions) into two stripe regions 32 to be strip-like in the Y direction for the second time writing layer (second stripe layer: STL_Q2). The second stripe layer is composed of the two stripe regions 32.

As mentioned above, the example of FIG. 3 is composed of the three stripe layers. Conventionally, the first stripe layer (STL_P1) of the writing group P and the first and the second stripe layers (STL_Q1 and STL_Q2) of the writing group Q are written as separate writing processing. However, according to Embodiment 1, they are combined to be written as one writing processing.

In S108, as the order setting step, using a plurality of regions of all the writing groups, the order setting unit 116 sets an order of each stripe region such that the reference position of each stripe region is located in order in a predetermined direction (in this case, the Y direction) regardless of the writing group.

Figure 4:
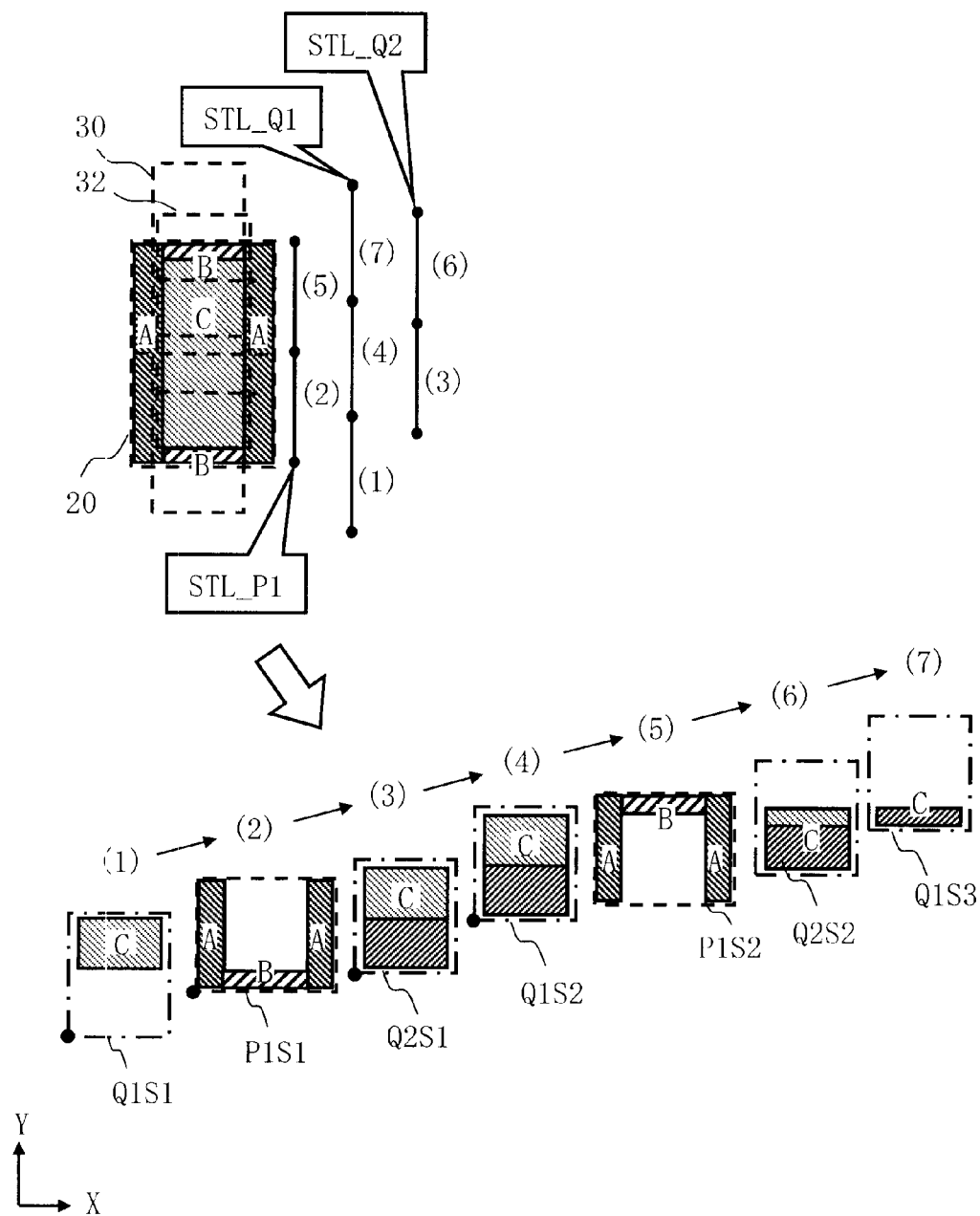
FIG. 4 is a schematic diagram for illustrating a writing order of a plurality of stripe regions according to Embodiment 1.

FIG. 4 is a schematic diagram for illustrating the writing order of a plurality of stripe regions according to Embodiment 1. With respect to the two stripe regions 20, the three stripe regions 30, and the two stripe regions 32 shown in FIG. 3, an ascending sort is performed, for example, treating the position of the lower left corner as a reference position, so that reference positions may be sorted according to the Y coordinate in the ascending order. Consequently, as shown in FIG. 4, the sorting is performed to have the order of the stripe region Q1S1 of the first stripe layer of the writing group Q at the head, the stripe region P1S1 of the first stripe layer of the writing group P, the stripe region Q2S1 of the second stripe layer of the writing group Q, the stripe region Q1S2 of the first stripe layer of the writing group Q, the stripe region P1S2 of the first stripe layer of the writing group P, the stripe region Q2S2 of the second stripe layer of the writing group Q, and the stripe region Q1S3 of the first stripe layer of the writing group Q at the last. Thus, the order setting unit 116 sets the order of each stripe region as just described above.

In S110, as the data conversion processing step, the data conversion processing unit 118 reads layout data corresponding to each stripe region from the storage device 140, performs conversion processing of a plurality of steps to generate shot data for each stripe region, and stores it in the storage device 148. It is preferable for the data conversion processing unit 118 to perform data conversion so that shot data of each stripe region may be temporarily stored according to the order described above. However, since layout data is a large amount, it is preferable to further divide each stripe region into a plurality of small regions and to perform parallel processing of data of the plurality of small regions. In that case, data conversion processing of data on the plurality of stripe regions may be carried out at the same time period.

In S112, as the writing step, the control circuit 120 reads shpt data in each stripe region from the storage device 148 according to the order which has been set, and writes a pattern of each stripe region by controlling the writing unit 150 onto the target workpiece 101 according to the set order by using an electron beam 200. When writing each stripe region, the writing is respectively performed under the writing conditions set by writing parameters. The writing unit 150 specifically operates as follows:

The electron beam 200 emitted from the electron gun assembly 201 (emitting unit) irradiates the entire first aperture plate 203 having a quadrangular, such as a rectangular, opening by the illumination lens 202. At this point, the electron beam 200 is shaped to be a quadrangle such as a rectangle. Then, after having passed through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam. After having passed through the second aperture plate 206, the electron beam 200 of a second aperture image is focused by the objective lens 207 and deflected by the main deflector 208 and the sub-deflector 209, and reaches a desired position on the target workpiece 101 on the XY stage 105 which continuously moves. FIG. 1 shows the case where a multi-stage deflection of the main and sub two-stage is used for the position deflection. In such a case, what is needed is to deflect the electron beam 200 to the reference position of a subfield (SF), being a small region made by virtually dividing the stripe region, by the main deflector 208 while following the stage movement, and to deflect the beam reaching each irradiation position in the SF by the sub-deflector 209.

Figures 5, 6:
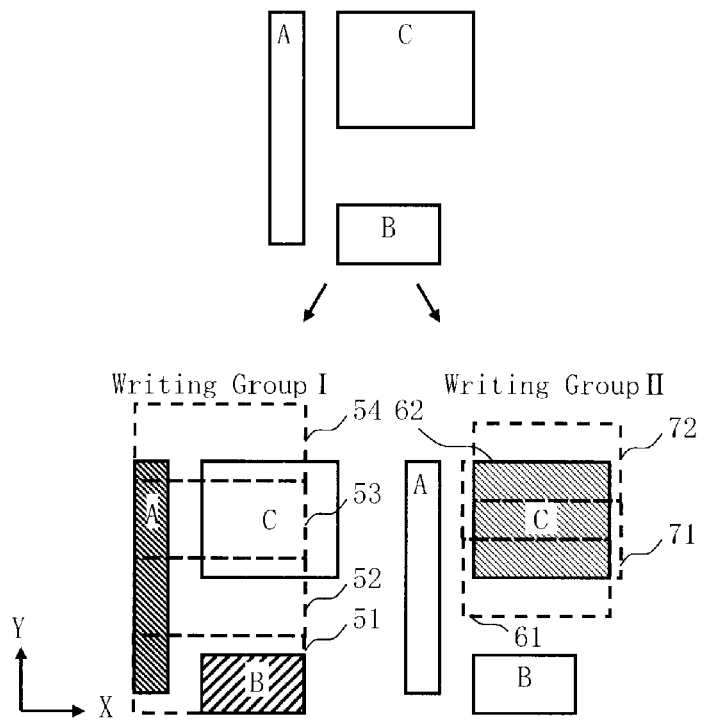
FIG. 5 shows examples of a plurality of chips, writing groups, and writing conditions of each writing group according to Embodiment 1.
FIG. 6 is a schematic diagram showing a plurality of chips, a plurality of writing groups, and the stripe region of each writing group of FIG. 5.

FIG. 5 shows examples of a plurality of chips, writing groups, and writing conditions of each writing group according to Embodiment 1. In this case, chips A, B, and C are arranged such that the writing group I is composed of chips A and B and the writing group II is composed of chip C. As the writing conditions with respect to the writing group I, dividing is performed by the stripe height of 200 μm, the stage movement path of the XY stage 105 proceeds in the order of forward(FWD)-backward(BWD), writing is performed with multiplicity N=1, and the XY stage 105 moves at a constant speed. As the writing conditions with respect to the writing group II, dividing is performed by the stripe height of 200 μm, the stage movement path of the XY stage 105 proceeds in the order of forward(FWD)-forward(FWD), writing is performed with multiplicity N=2, and the XY stage 105 moves at a variable speed.

FIG. 6 is a schematic diagram showing a plurality of chips, a plurality of writing groups, and the stripe region of each writing group of FIG. 5. As shown in FIG. 6, the writing group I composed of chips A and B is divided into four stripe regions 51, 52, 53, and 54. The writing group II composed of chip C is divided into two stripe regions 61 and 62 of the first stripe layer, and two stripe regions 71 and 72 of the second stripe layer.

Figure 7:
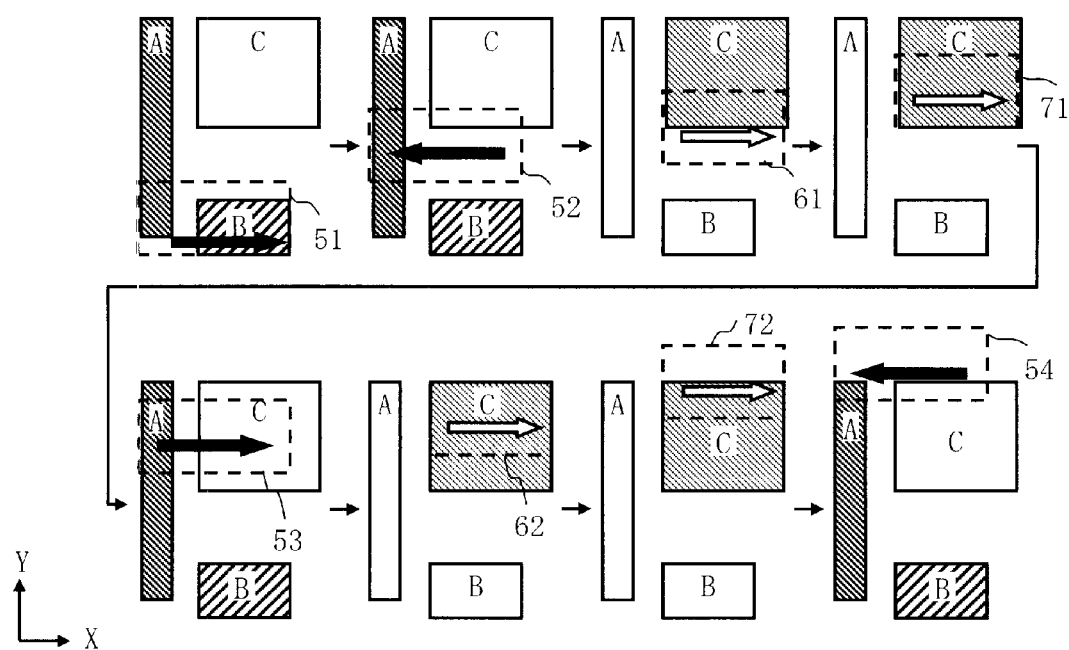
FIG. 7 is a schematic diagram showing a writing order of a plurality of chips of FIG. 6.

FIG. 7 is a schematic diagram showing a writing order of plurality of chips of FIG. 6. In Embodiment 1, since an ascending sort is performed according to the Y coordinate with respect to all the stripe regions 51, 52, 53, 54, 61, 62, 71, and 72, treating the lower left corner as a reference position, for example, thereby writing proceeds in the order shown in FIG. 7. In FIG. 7, first, the stripe region 51 of the writing group I is written in the X direction (FWD). Next, the stripe region 52 of the writing group I is written in the −X direction (BWD). Next, the stripe region 61 of the writing group II is written in the X direction (FWD). Next, the stripe region 71 of the writing group II is written in the X direction (FWD). Next, the stripe region 53 of the writing group I is written in the X direction (FWD). Next, the stripe region 62 of the writing group II is written in the X direction (FWD). Next, the stripe region 72 of the writing group II is written in the X direction (FWD). Then, lastly, the stripe region 54 of the writing group II is written in the −X direction (BWD). That is, in the writing group I, the writing is performed in the order of FWD→BWD→FWD→BWD according to the writing conditions shown in FIG. 5, and in the writing group II, the writing is performed in the order of FWD→FWD→FWD→FWD according to the writing conditions shown in FIG. 5. When at least part of regions of different writing groups overlap each other, after the region of the writing group whose reference position is precedingly located at the Y coordinate has been written, the region of the other writing group is written.

In Embodiment 1, as described above, an ascending sort is performed in the Y direction, for example, with respect to the stripes of all the stripe layers of a plurality of writing groups, regardless of the writing conditions, and then, writing is carried out according to the sorted order. Thereby, the writing can be executed by one-time writing processing. Therefore, it is possible to save a fixed time conventionally needed for information generation of writing processing between writing groups, and a processing time, such as an initialization time, conventionally needed between writing processing. Thus, it is possible to reduce the writing processing time to the time of one-time writing processing. Moreover, it is possible to reduce the movement time of the XY stage 105 with the target workpiece 101 thereon when shifting from the final position of a certain writing group to the starting position of the next writing group. Therefore, the writing time in the case of writing a plurality of writing groups having different writing conditions can be shortened.

Embodiment 2

In Embodiment 1, the circumscribing frame is set, for each writing group, such that it circumscribes a chip in the writing group concerned. However, it is not limited thereto. In Embodiment 2, the case of setting a frame by other method will be described. In Embodiment 2, the apparatus structure is the same as that in FIG. 1, each step of the writing method is the same as that in FIG. 2, and the content of each step is the same as that described in Embodiment 1 except for the points described below.

Figure 8:
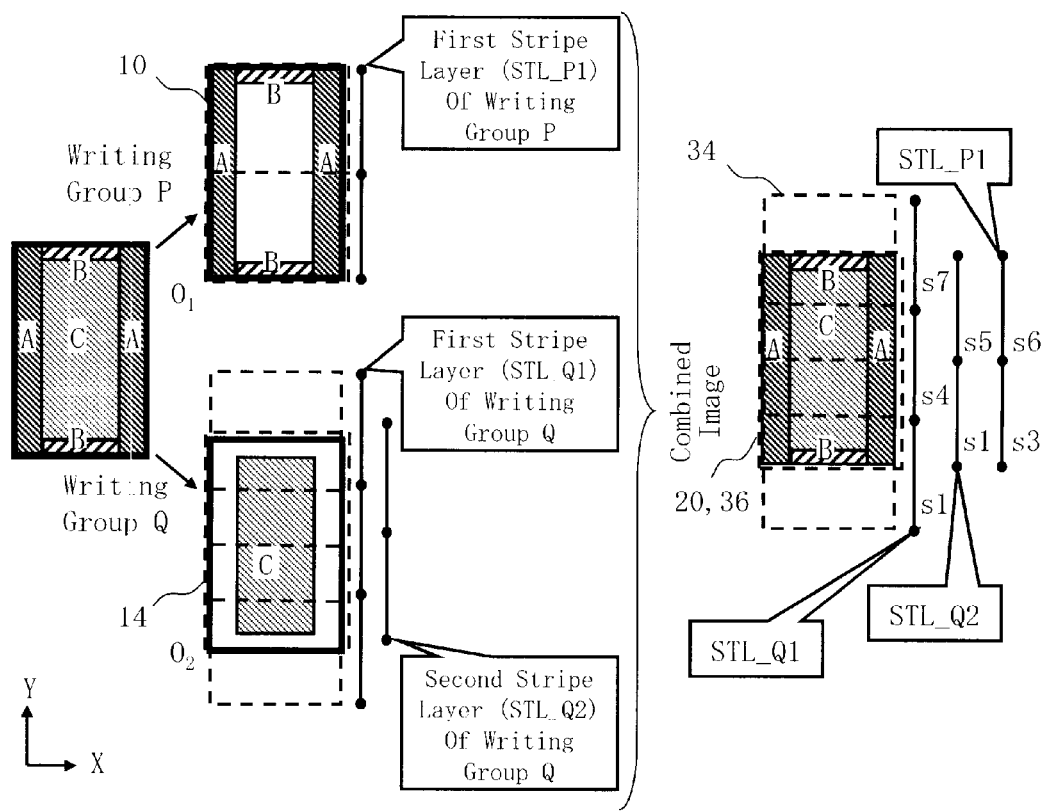
FIG. 8 is a schematic diagram for illustrating a writing group and a combined stripe layer according to Embodiment 2.

FIG. 8 is a schematic diagram for illustrating a writing group and a combined stripe layer according to Embodiment 2. In the case of FIG. 8, the three chips A, B, and C are arranged as shown in the figure. In the example of FIG. 8, similar to FIG. 3, the rectangular chip C is arranged in the center. Then, two rectangular chips A which are long in the Y direction (vertically long) are arranged such that they sandwich chip C and two chips B, from the right and left respectively. The length in the Y direction of chip A is defined to be the same as the total length in the Y direction of chip C and two chips B. Two chips B which are long in the X direction (horizontally long) are arranged such that they sandwich chip C from the upper and lower sides respectively. The length in the X direction of chip B is made to be the same as the length in X direction of chip C. In this case, chips A and B are written with multiplicity 1, and chip C is written with multiplicity 2. Other writing conditions of chip A and chip B shall be identical with each other. Moreover, the content of the writing group setting step (S102) is the same as that described in Embodiment 1.

Next, in S104, as the frame setting step, the frame setting unit 112 reads group information on a writing group and writing conditions of each writing group from the storage device 146, and sets, for each writing group, a frame which encloses the whole of all the chip regions in all the writing groups. The frame according to Embodiment 2 is set such that it encloses the whole of all the chip regions in all the writing groups while circumscribing the chip regions located at the outer peripheral side. In FIG. 8, with respect to the writing group P, since chip C is arranged inside the two chips A and two chips B, consequently, the circumscribing frame 10 formed to be rectangular is set such that it contacts the outer peripheral sides of two chips A and two chips B similarly to Embodiment 1. However, with respect to the writing group Q, since not only chip C but also two chips A and two chips B are enclosed, consequently, a circumscribing frame 14, being the same size as the circumscribing frame 10 formed to be rectangular, is set such that it contacts the outer peripheral sides of two chips A and two chips B. Thus, by applying the circumscribing frame, it becomes possible to set a rectangular frame of the minimum size enclosing the whole of all the chip regions in all the writing groups.

Next, in S106, as the stripe dividing step, the stripe dividing unit 114 virtually divides each writing group into a plurality of stripe regions in a predetermined direction. In the example of FIG. 8, with respect to the writing group P, similarly to Embodiment 1, the circumscribing frame 10 is virtually divided by the stripe height set by a writing parameter (writing conditions), into two stripe regions 20 to be strip-like in the Y direction. The first stripe layer (STL_P1) is composed of the two stripe regions 20.

On the other hand, with respect to the writing group Q, since it is written with multiplicity N=2, first, the circumscribing frame 14 is virtually divided by the stripe height specified by a writing parameter (writing conditions) into three stripe regions 34 to be strip-like in the Y direction for the first time writing layer (first stripe layer: STL_Q1). The first stripe layer composed of the three stripe regions 34. A frame whose length is obtained by respectively adding one-half (½) of the stripe height, in the Y direction and in the –Y direction, to the circumscribing frame 14 is divided into the three stripe regions 34. In this case, since the multiplicity is N=2, one-half of the stripe height is added. For example, if the case is multiplicity N=4, three-fourth (¾) of the stripe height will be added. Furthermore, with respect to the writing group Q, the circumscribing frame 14 is virtually divided by the stripe height specified by a writing parameter (writing conditions) into two stripe regions 36 to be strip-like in the Y direction for the second time writing layer (second stripe layer: STL_Q2). The second stripe layer is composed of the two stripe regions 36. Since the example of FIG. 8 shows the case where both the writing groups P and Q have the same stripe height, consequently, the two stripe regions 20 and the two stride regions 36 are the same regions.

As mentioned above, the example of FIG. 8 is composed of the three stripe layers. Conventionally, the first stripe layer (STL_P1) of the writing group P and the first and the second stripe layers (STL_Q1 and STL_Q2) of the writing group Q are written as separate writing processing. However, according to Embodiment 2, they are combined to be written as one writing processing.

In S108, as the order setting step, using a plurality of regions of all the writing groups, the order setting unit 116 sets an order of each stripe region such that the reference position of each stripe region is located in order in a predetermined direction (in this case, the Y direction) regardless of the writing group.

Figure 9:
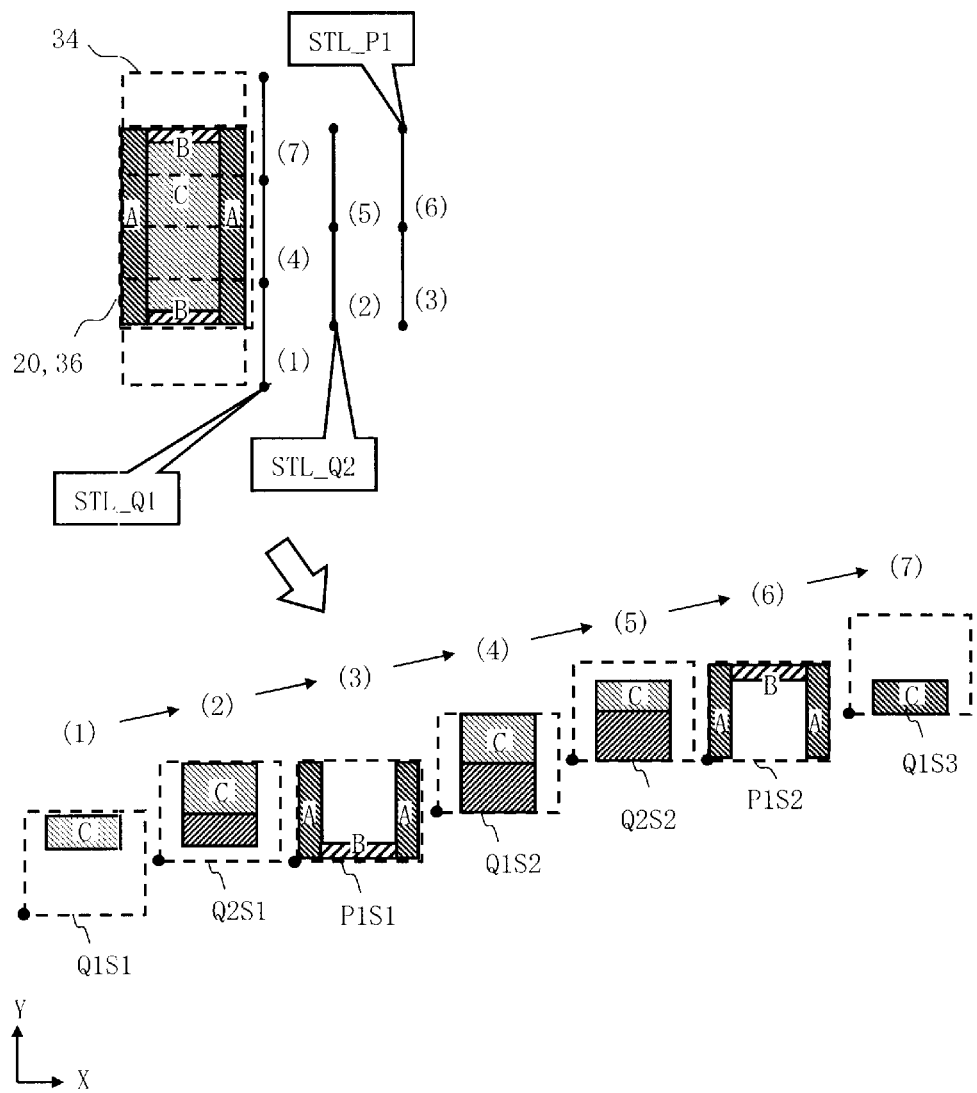
FIG. 9 is a schematic diagram for illustrating a writing order of a plurality of stripe regions according to Embodiment 2.
Figure 10:
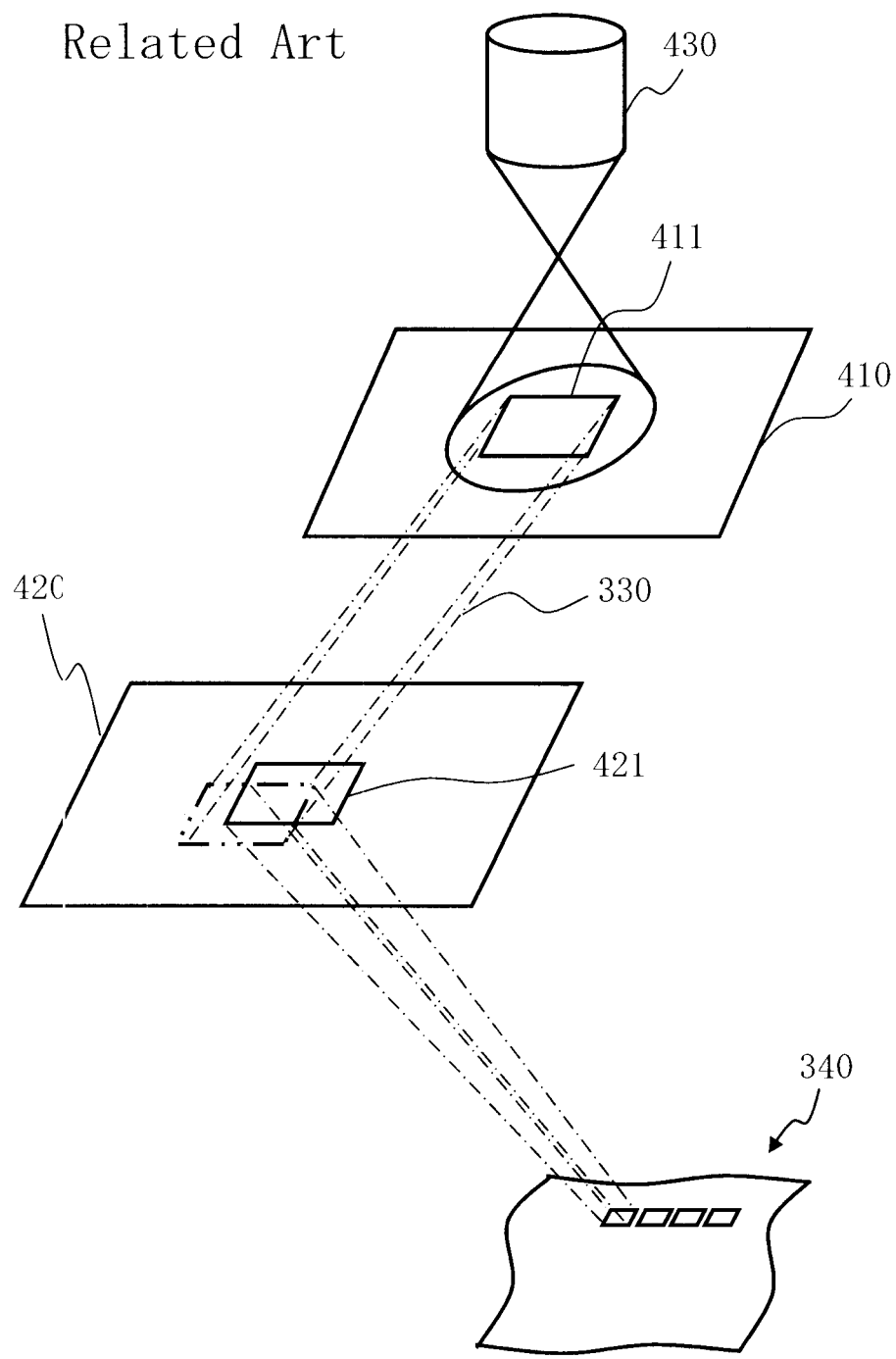
FIG. 10 is a schematic diagram for illustrating operations of a variable-shaped electron beam writing apparatus.
Figure 11:
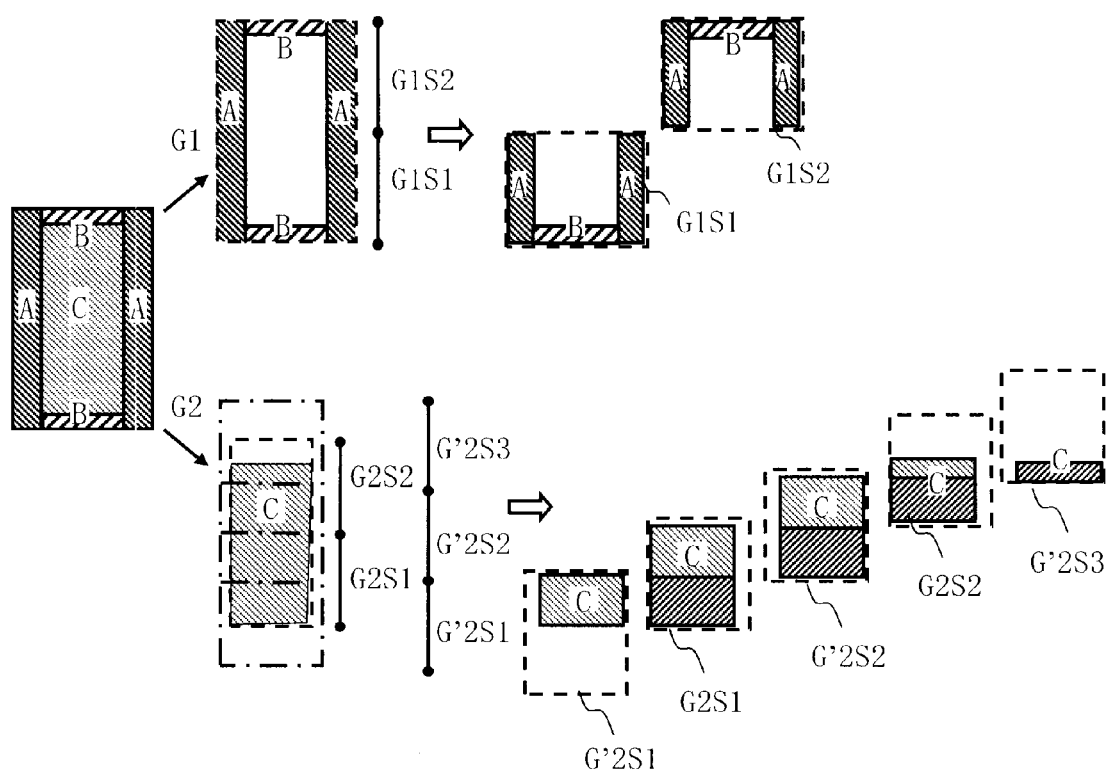
FIG. 11 is a schematic diagram for illustrating writing groups and a writing order.

FIG. 9 is a schematic diagram for illustrating the writing order of a plurality of stripe regions according to Embodiment 2. With respect to the two stripe regions 20, the three stripe regions 34, and the two stripe regions 36 shown in FIG. 8, an ascending sort is performed, for example, treating the position of the lower left corner as a reference position, so that reference positions may be sorted according to the Y coordinate in the ascending order. Consequently, as shown in FIG. 9, the sorting is performed to have the order of the stripe region Q1S1 of the first stripe layer of the writing group Q at the head, the stripe region Q2S1 of the second stripe layer of the writing group Q, the stripe region P1S1 of the first stripe layer of the writing group P, the stripe region Q1S2 of the first stripe layer of the writing group Q, the stripe region Q2S2 of the second stripe layer of the writing group Q, the stripe region P1S2 of the first stripe layer of the writing group P, and the stripe region Q1S3 of the first stripe layer of the writing group Q at the last. Thus, the order setting unit 116 sets the order of each stripe region as just described above. In the example of FIG. 9, since the two stripe regions 20 and the two stripe regions 36 have the same positional relationship, whichever of them may be sorted first.

Then, the data conversion processing step (S110) and the writing step (S112) may be carried out similarly to Embodiment 1.

Thus, according to Embodiment 2, it is possible to make the circumscribing frame be in common as mentioned above, in addition to the effects according to Embodiment 1. Therefore, the amount of data on the circumscribing frame can be reduced.

According to Embodiments described above, each region is written in a predetermined direction regardless of the writing group. Therefore, it is enough for the length of stage movement to be short. Then, the time of stage movement can be shortened. Moreover, according to the configuration described above, writing processing can be performed not as writing processing for each writing group but as a series of writing processing for all the writing groups collected. Therefore, it is possible to save a fixed time needed for information generation between writing processing, and a processing time, such as an initialization time, needed between writing processing.

Thus, it is possible to reduce the writing time in the case of writing a plurality of writing groups having different writing conditions.

Referring to specific examples, Embodiments have been described above. However, the present invention is not limited to these examples.

While description of the apparatus structure, control method, etc. not directly required for explaining the present invention is omitted, some or all of them may be suitably selected and used when needed. For example, although the structure of the control unit for controlling the writing apparatus 100 is not described, it should be understood that a necessary control unit structure is to be selected and used appropriately.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a storage device configured to input layout information of a plurality of chips on which pattern formation is to be achieved, and store the layout information;
a writing group setting unit configured to set, using the layout information, a plurality of writing groups each being composed of at least one of the plurality of chips and each having writing conditions differing from each other;
a frame setting unit configured to set, for each of the plurality of writing groups, a frame which encloses a whole of all chip regions in the each of the plurality of writing groups;
a region dividing unit configured to virtually divide the frame into a plurality of stripe regions in a predetermined direction, with respect to the each of the plurality of writing groups;
an order setting unit configured to set, using the plurality of stripe regions of all the plurality of writing groups, an order of each of the plurality of stripe regions such that a reference position of the each of the plurality of stripe regions is located in order in the predetermined direction regardless of the plurality of writing groups; and
a writing unit configured to write a pattern in the each of the plurality of stripe regions onto a target workpiece according to the order which has been set, by using a charged particle beam.

2. The apparatus according to claim 1, wherein the writing conditions include at least one of multiplicity, a stage movement path of a stage with the target workpiece thereon, a speed of the stage, a dividing height of the plurality of stripe regions, and a dose of the charged particle beam.

3. The apparatus according to claim 1, wherein the frame is set such that it encloses the whole of all the chip regions in the each of the plurality of writing groups while circumscribing chip regions located at an outer peripheral side.

4. The apparatus according to claim 1, wherein the frame is set such that it encloses the whole of all the chip regions in all the plurality of writing groups while circumscribing chip regions located at an outer peripheral side.

5. The apparatus according to claim 1, wherein when at least part of the plurality of stripe regions of different writing groups of the plurality of writing groups overlap each other, after a stripe region of one of the different writing groups has been written, a stripe region of another of the different writing groups is to be written.

* * * * *